(12) United States Patent
Helberg et al.

(10) Patent No.: US 11,314,294 B2
(45) Date of Patent: Apr. 26, 2022

(54) MODULAR HEAT SINK SUPPORTING EXPANSION CARD CONNECTOR

(71) Applicant: Dell Products, L.P., Round Rock, TX (US)

(72) Inventors: Chris M. Helberg, Austin, TX (US); Travis C. North, Cedar Park, TX (US)

(73) Assignee: Dell Products, L.P., Round Rock, TX (US)

( * ) Notice: Subject to any disclaimer, the term of this patent is extended or adjusted under 35 U.S.C. 154(b) by 223 days.

(21) Appl. No.: 16/862,832

(22) Filed: Apr. 30, 2020

(65) Prior Publication Data
US 2021/0341976 A1 Nov. 4, 2021

(51) Int. Cl.
| | |
|---|---|
| G06F 1/20 | (2006.01) |
| G06F 1/18 | (2006.01) |
| G06F 13/42 | (2006.01) |
| H05K 7/20 | (2006.01) |

(52) U.S. Cl.
CPC ............. *G06F 1/20* (2013.01); *G06F 1/185* (2013.01); *G06F 13/4282* (2013.01); *H05K 7/20163* (2013.01); *G06F 2213/0042* (2013.01)

(58) Field of Classification Search
CPC ............. H01L 23/4093; H01L 23/3672; H01L 2023/4056; H01L 2023/405; G06F 1/20; G06F 1/185; H05K 1/0203; H05K 2201/066; H05K 7/2039; F28D 2021/0029

USPC ......... 361/704, 679.54, 719, 697, 690, 695, 361/703, 709, 702, 720, 679.32, 707; 165/80.3, 104.33; 174/16.3; 257/718, 257/722

See application file for complete search history.

(56) References Cited

U.S. PATENT DOCUMENTS

2012/0000625 A1\* 1/2012 Tan .................... H01L 23/36
165/80.1

\* cited by examiner

*Primary Examiner* — Mandeep S Buttar
(74) *Attorney, Agent, or Firm* — Fogarty LLP

(57) ABSTRACT

Modular heat sinks are provided that support configurations using combinations of cooling and expansion card components, whereby the expansion card may support coupled devices. Heat sinks may include a fin set that is permanently fixed to the heat sink and a second fin set that can be decoupled from a location on the heat sink base. The second fin set can instead be replaced on the heat sink base by an expansion card connector, such as a M.2 expansion card connector. In some embodiments, an expansion card connector also includes a fin set, with the expansion card connector fastened on top of that fin set. The fin set to which the expansion card connector is fastened may include multiple tiers of fins of different heights that may conform to the space available to the heat sink, thus maximize cooling capabilities of the heat sink while also supporting an expansion card.

20 Claims, 6 Drawing Sheets

MODULAR HEAT SINK SUPPORTING EXPANSION CARD CONNECTOR

FIELD

This disclosure relates generally to cooling internal components of an Information Handling System (IHS), and more specifically, to airflow cooling within an IHS.

BACKGROUND

As the value and use of information continues to increase, individuals and businesses seek additional ways to process and store information. An option is an Information Handling System (IHS). An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, global communications, etc. In addition, IHSs may include a variety of hardware and software components that may be configured to process, store, and communicate information and may include one or more computer systems, data storage systems, and networking systems.

Components of an IHS consume electrical power and can generate significant amounts of heat. Heat within an IHS may degrade the reliability and performance of various internal components of the IHS, possibly resulting in costly malfunctions and component failures. In order to circulate heated air away from its internal components, an IHS may utilize a cooling fan to ventilate heated air from inside the IHS and thus away from the heat-generating internal components. As IHSs continue to get smaller in size, the density of components within IHSs tends to increase, thus presenting additional challenges in supporting airflow cooling.

SUMMARY

In various embodiments, heat sinks are provided for dissipating heat within an IHS (Information Handling System). The heat sinks include: a first fin set that is permanently fixed to the heat sink; a second fin set that is removably coupled to a first location on a base of the heat sink; and an expansion card connector that is removably coupled to the first location on the base of the heat sink. In additional heat sink embodiments, the expansion card connector comprises a third fin set, and wherein the expansion card connector is fastened on top of the third fin set. In additional heat sink embodiments, the third fin set of the expansion card connector comprises of a plurality of tiers of fins. In additional heat sink embodiments, the expansion card connector is fastened on top of a lowest tier of the third fin set. In additional heat sink embodiments, the base of the heat sink comprises a plurality of channels that receive a corresponding plurality of rails of the second fin set. In additional heat sink embodiments, the plurality of channels of the heat sink base further receive a corresponding plurality of rails of the expansion card connector. In additional heat sink embodiments, the second fin set is coupled to the base of the heat sink by sliding the plurality of rails of the second fin set into the corresponding channels of the base. In additional heat sink embodiments, the expansion card connector comprises an M.2 connector. In additional heat sink embodiments, the expansion card connector comprises a USB-C connector.

In various additional embodiments, heat sinks are provided for dissipating heat within an IHS (Information Handling System). The heat sinks include: a first fin set that is removably coupled to a first location on a base of the heat sink; a second fin set that is removably coupled to a second location on the base of the heat sink; and an expansion card connector that is removably coupled to the first location or to the second location on the base of the heat sink.

In various additional embodiments, IHSs (Information Handling Systems) include: a processor; a plurality of cooling fans directing airflow towards a heat sink; and the heat sink including: a first fin set that is permanently fixed to the heat sink; a second fin set that is removably coupled to a first location on a base of the heat sink; and an expansion card connector that is removably coupled to the first location on the base of the heat sink.

In additional IHS embodiments, the expansion card connector comprises a third fin set, and wherein the expansion card connector is fastened on top of the third fin set. In additional IHS embodiments, the third fin set of the expansion card connector comprises of a plurality of tiers of fins, and wherein the expansion card connector is fastened on top of a lowest tier of the third fin set. In additional IHS embodiments, the base of the heat sink comprises a plurality of channels that receive a corresponding plurality of rails of the second fin set. In additional IHS embodiments, the expansion card connector comprises an M.2 connector or a USB-C connector. In additional IHS embodiments, an expansion card is coupled to the IHS by coupling the expansion card to the expansion card connector.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity and have not necessarily been drawn to scale.

DETAILED DESCRIPTION

Figure 1:
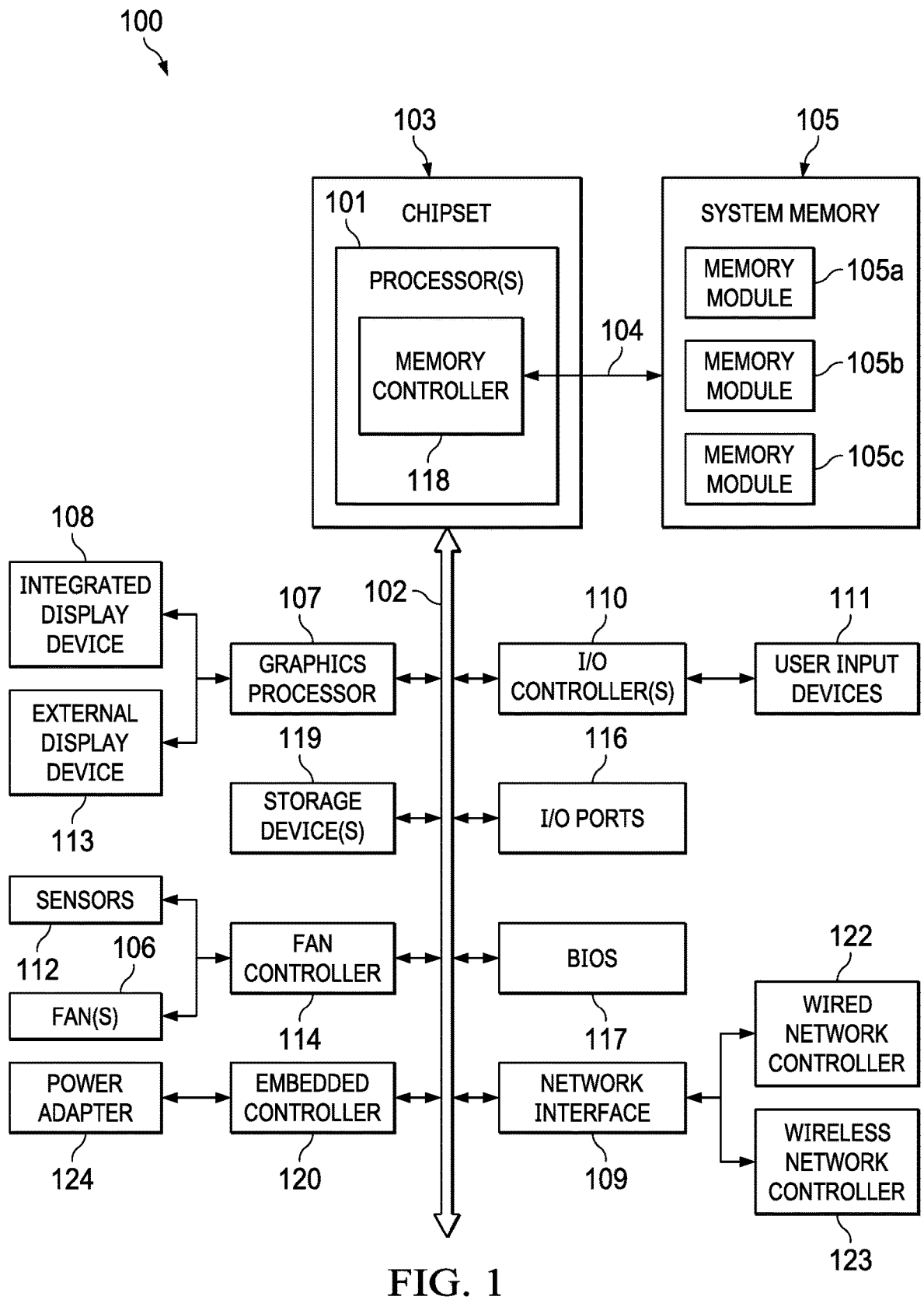
FIG. 1 is a block diagram depicting certain components of an IHS configured according to embodiments for use of airflow cooling and a modular heat sink that supports an expansion card connector.

For purposes of this disclosure, an IHS may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an IHS may be a personal computer (e.g., desktop or laptop), tablet computer, mobile device (e.g., Personal Digital Assistant (PDA) or smart phone), server (e.g., blade server or rack server), a network storage device, or any other suitable device and may vary in size, shape, performance, functionality, and price. An IHS may include Random Access Memory (RAM), one or more processing resources, such as a Central Processing Unit (CPU) or hardware or software control logic, Read-Only Memory (ROM), and/or other types of nonvolatile memory. Additional components of an IHS may include one or more disk drives, one or more network ports for communicating with external devices as well as various I/O devices, such as a keyboard, a mouse, touchscreen, and/or a video display. An IHS may also include one or more buses operable to transmit communications between the various hardware components. FIG. 1 shows an example of an IHS configured to implement the systems and methods described herein. It should be appreciated that although certain IHS embodiments described herein may be discussed in the context of a personal computing device, other embodiments may be utilized.

FIG. 1 is a block diagram illustrating certain components of an IHS 100 configured according to certain embodiments for airflow cooling that utilizes a modular heat sink that supports an expansion card connector. IHS 100 includes one or more processors 101, such as a Central Processing Unit (CPU), that execute code retrieved from a system memory 105. Although IHS 100 is illustrated with a single processor 101, other embodiments may include two or more processors, that may each be configured identically, or to provide specialized processing functions. Processor 101 may include any processor capable of executing program instructions, such as an Intel Pentium™ series processor or any general-purpose or embedded processors implementing any of a variety of Instruction Set Architectures (ISAs).

In the embodiment of FIG. 1, the processor 101 includes an integrated memory controller 118 that may be implemented directly within the circuitry of the processor 101, or the memory controller 118 may be a separate integrated circuit that is located on the same die as the processor 101. The memory controller 118 may be configured to manage the transfer of data to and from the system memory 105 of the IHS 100 via a high-speed memory interface 104. The system memory 105 that is coupled to processor 101 provides the processor 101 with a high-speed memory that may be used in the execution of computer program instructions by the processor 101. Accordingly, system memory 105 may include memory components, such as such as static RAM (SRAM), dynamic RAM (DRAM), NAND Flash memory, suitable for supporting high-speed memory operations by the processor 101. In certain embodiments, system memory 105 may combine both persistent, non-volatile memory and volatile memory. In certain embodiments, the system memory 105 may be comprised of multiple removable memory modules.

IHS 100 utilizes a chipset 103 that may include one or more integrated circuits that are connect to processor 101. In the embodiment of FIG. 1, processor 101 is depicted as a component of chipset 103. In other embodiments, all of chipset 103, or portions of chipset 103 may be implemented directly within the integrated circuitry of the processor 101. Chipset 103 provides the processor(s) 101 with access to a variety of resources accessible via bus 102. In IHS 100, bus 102 is illustrated as a single element. Various embodiments may utilize any number of separate buses to provide the illustrated pathways served by bus 102.

In various embodiments, IHS 100 may include one or more I/O ports 116 that may support removeable couplings with various types of devices and systems. In some instances, I/O ports 116 may support removeable couplings with external user devices and systems. Users may regularly couple and decouple devices and systems from such external I/O ports 116. For instance, external I/O 116 ports may include USB (Universal Serial Bus) ports, by which a variety of devices and systems may be coupled to IHS 100. Other external I/O ports 116 may support various types of network connections, thus coupling IHS 100 to external systems. Other external I/O ports 116 may support connections with devices and systems via a variety of externally accessible connectors of a variety form factors.

In some instances, I/O ports 116 may support removeable couplings with internal devices and systems. Such internal I/O ports 116 may support removeable couplings, but coupling and decoupling devices from such internal ports may require opening the enclosure of the IHS 100 in order to access its internal components. Administrators may occasionally couple and decouple devices and systems from such internal I/O ports 116 in order to re-purpose an IHS 100 and/or to upgrade or customize its capabilities. For instance, internal I/O ports 116 may include M.2 connectors that support coupling various types of expansion cards to IHS 100, such as solid-state storage expansion cards and wireless network controller expansion cards. Internal I/O ports 116 may also utilize various other types of expansion card connectors, such as USB-C connectors. As described in additional detail below, in various embodiments, one or more expansion card connectors utilized by internal I/O ports 116 may be components of a modular heatsink, where the modular heatsink includes a connector and provides an surface for fastening an expansion card to the IHS 100 once it has been coupled to the connector. Using a modular heatsink according to embodiments, modular components of the heatsink, including internal I/O port 116 connectors and fin sets may be interchanged, thus allowing the performance and airflow cooling characteristics of IHS 100 to be tailored to specific computing demands.

In certain embodiments, chipset 103 may additionally utilize one or more I/O controllers 110 that may each support the operation of hardware components such as user I/O devices 111 that may include peripheral components that are physically coupled to an I/O port 116 and/or peripheral components that are wirelessly coupled to IHS 100 via a network interface 109. In various embodiments, I/O controller 110 may support the operation of one or more user I/O devices 110 such as a keyboard, mouse, touchpad, touchscreen, microphone, speakers, camera and other input and output devices that may be coupled to IHS 100. As described, user I/O devices 111 may interface with an I/O controller 110 through wired or wireless couplings supported by IHS 100.

As described, IHS 100 may support one or more of network interfaces 109 that may support different types of network connectivity. In certain embodiments, IHS 100 may include one or more Network Interface Controllers (NICs) 122, 123, each of which may implement the hardware required for communicating via a specific networking technology, such as Wi-Fi, BLUETOOTH, Ethernet and mobile cellular networks (e.g., CDMA, TDMA, LTE). As illustrated, network interface 109 may support network connections by wired network controllers 122 and wireless network controllers 123. Each network controller 122, 123 may be coupled via various buses to the chipset 103 of IHS 100 in supporting different types of network connectivity, such as the network connectivity utilized by the operating system of IHS 100. In certain embodiments, such network connectivity may support configuration of IHS 100 as a member of an enterprise network by which a variety of computing services may be provided to a user of IHS 100. In certain embodiments, a network interface 109 may be provided by a wireless network controller 123 that is coupled to IHS 100 via an internal M.2 connector.

Chipset 103 may also provide access to one or more display device(s) 108, 113 via graphics processor 107. In certain embodiments, graphics processor 107 may be comprised within a video card, graphics card or within an embedded controller installed within IHS 100. In certain embodiments, graphics processor 107 may be integrated within processor 101, such as a component of a system-on-chip. Graphics processor 107 may generate display information and provide the generated information to one or more display device(s) 108, 113 coupled to the IHS 100. The one or more display devices 108, 113 coupled to IHS 100 may utilize LCD, LED, OLED, or other display technologies. Each display device 108, 113 may be capable of receiving touch inputs such as via a touch controller that may be an embedded component of the display device 108, 113 or graphics processor 107, or may be a separate component of IHS 100 accessed via bus 102. In some embodiments, power to graphics processor 107, integrated display device 108 and/or external display 133 may be turned off, or configured to operate at minimal power levels, in response to IHS 100 entering a low-power state.

Chipset 103 also provides processor 101 with access to one or more storage devices 119. In various embodiments, a storage device 119 may be integral to the IHS 100 or may be external to the IHS 100. In certain embodiments, storage device 119 may be accessed via a storage controller that may be an integrated component of the storage device. Storage device 119 may be implemented using any memory technology allowing IHS 100 to store and retrieve data. For instance, storage device 119 may be a magnetic hard disk storage drive or a solid-state storage drive. In certain embodiments, storage device 119 may be a system of storage devices, such as a cloud system or enterprise data management system that is accessible via network interface 109. In certain embodiments, certain solid state storage device may be coupled to IHS 100 via an internal M.2 connector.

As illustrated, IHS 100 also includes a BIOS (Basic Input/Output System) 117 that may be stored in a non-volatile memory accessible by chipset 103 via bus 102. The BIOS 117 provides an abstraction layer that allows the operating system to interface with the hardware components of the IHS 100. Upon powering or restarting IHS 100, processor(s) 101 may utilize BIOS 117 instructions to initialize and test hardware components coupled to the IHS 100, including both components permanently installed as components of the motherboard of IHS 100 and removable components installed within the various expansion slots supported by the IHS 100. The BIOS 117 instructions may also load an operating system for use by the IHS 100. The Unified Extensible Firmware Interface (UEFI) was designed as a successor to BIOS. As a result, many modern IHSs utilize UEFI in addition to or instead of a BIOS. As used herein, BIOS is intended to also encompass UEFI. In certain embodiments, the BIOS may be replaced, in full or in part, by a baseboard management controller (BMC) or another in-band or out-of-band controller that supports remote administration of IHS 100. In certain embodiments, the initialization of IHS 100 by BIOS 117 may be paused to allow for the validation of instructions utilized by a trusted component, such as by a secure processor, in order to establish a hardware root of trust in the trusted component that may then be utilized to support certain secure operations of IHS 100.

In the illustrated embodiment, IHS 100 includes a fan controller 114 that may be used to operate an airflow cooling system that may include one or more cooling fans 106. In certain embodiments, fan controller 114 may be include a processor or other logic unit and a memory for storage of firmware instructions used in the operation of the fan controller 114. In other embodiments, fan controller 114 may be implemented as a system-on-chip function of a processor 101 of IHS 100, or may be implemented by another controller, such as embedded controller 120. The fan controller 114 may be configured to interoperate with one or more sensors 112 in order to monitor temperature conditions at internal locations within the IHS 100, such as a core temperatures and junction temperatures collected by sensors 112 located in proximity to processor 101. Based on temperature measurements collected by sensors 112, the fan controller 114 may activate or increase the speed of cooling fans in order to ventilate heated air from within the IHS 100. As described in additional detail below, embodiments may utilize airflow cooling systems that include one or more modular heat sinks for use in dissipating heat that is ventilated by airflow controlled by fan controller 114. Modular heat sinks according to embodiments provide the ability to interchange modular heat sink components that may include various combinations of expansion card connectors and fin sets, thus allowing the cooling and performance characteristics of IHS 100 to be adapted for specific computing demands.

As illustrated, IHS 100 embodiments may utilize an embedded controller 120 that may be a motherboard component of IHS 100 and may include one or more logic units. In certain embodiments, embedded controller 120 may operate from a separate power plane from the main processors 101 of IHS 100, and thus also separate from the operating system functions of IHS 100. Firmware instructions utilized by embedded controller 120 may be used to operate a secure execution environment that may include operations for providing various core functions of IHS 100, such as for power management, via a power adapter 124, and for certain remote management functions.

In various embodiments, an IHS 100 does not include each of the components shown in FIG. 1. In various embodiments, an IHS 100 may include various additional components in addition to those that are shown in FIG. 1. Furthermore, some components that are represented as separate components in FIG. 1 may in certain embodiments instead be integrated with other components. For example, in certain embodiments, all or a portion of the functionality provided by the illustrated components may instead be provided by components integrated into the one or more processor(s) 101 as a systems-on-a-chip.

Figure 2B:
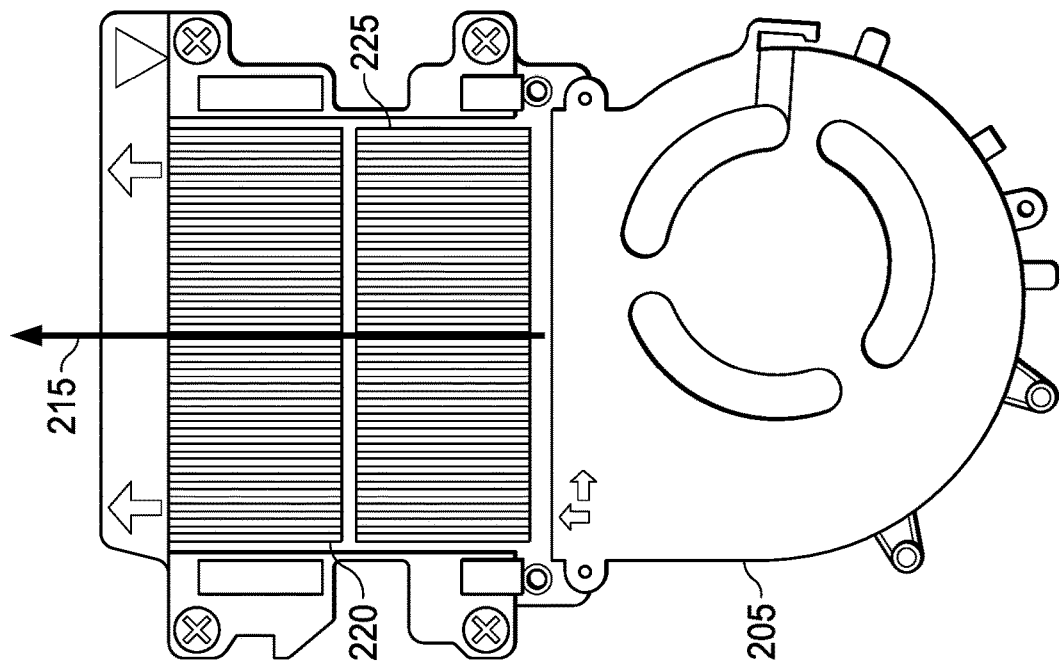
FIG. 2B is an illustration of an airflow cooling element consisting of a blower and a modular heatsink according to embodiments.
Figure 2A:
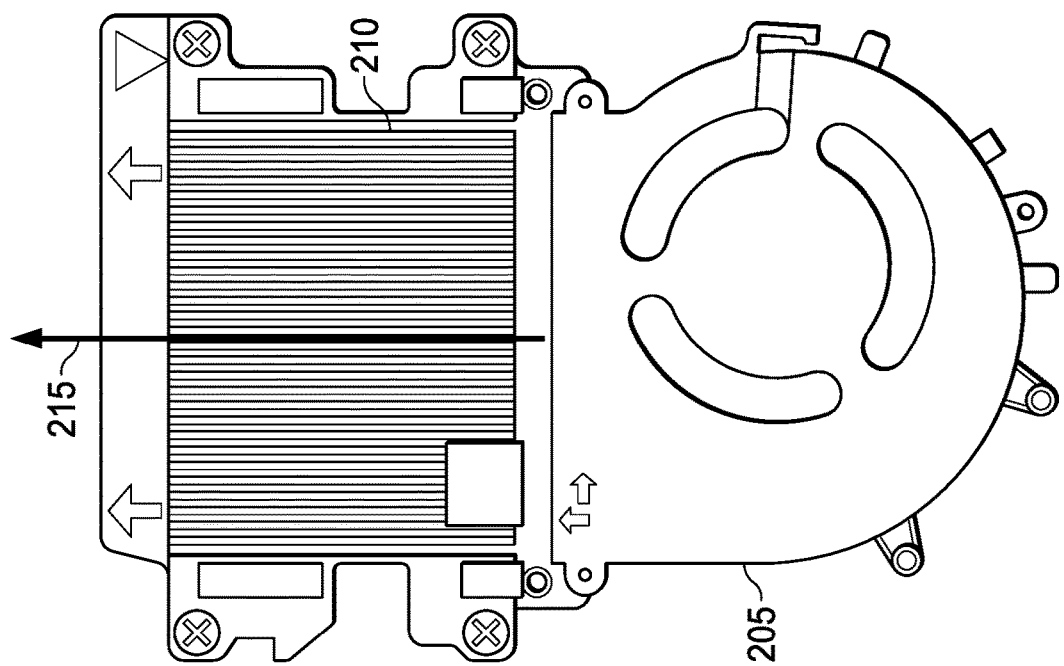
FIG. 2A is an illustration of an existing airflow cooling element consisting of a blower and an existing heatsink.

FIG. 2A is an illustration of an existing airflow cooling element consisting of a blower 205 and a one-piece heatsink 210. In the airflow cooling element in FIG. 2A, the illustrated blower 205 may be the cover of a blower assembly that draws air from a vent, plenum or other source of ambient air and redirects the air in direction 215 towards a heatsink 210. The cover of the blower 205 may be formed from materials such as stamped sheet metal and injected plastic. This illustrated cover of blower 205 serves to redirect ambient air that is drawn by the blower assembly from one axis to a perpendicular axis shown by arrow 215 in FIG. 2A. By redirecting ambient air along axis 215, the airflow generated by blower 205 ventilates heat that is dissipated by the fins of the heat sink 210. An airflow cooling element such as illustrated in FIG. 2A may be suitable for supporting airflow cooling within a notebook computer or other space-constrained device. In existing airflow cooling elements, heatsinks 210 are typically one-piece components that are formed from metal, such as aluminum alloys and copper. Existing heatsinks 210 may be constructed using separate pieces of metal, but these separate pieces are typically fastened together permanently, such as by welding, to form a one-piece heatsink. As such, existing one-piece heatsinks 210 may be replaced with larger and smaller one-piece heatsinks, but cannot be reconfigured within a constant amount of space to support different cooling and performance priorities.

FIG. 2B is an illustration of an airflow cooling element consisting of a blower 205 and a modular heatsink according to embodiments. As in FIG. 2A, the airflow cooling element illustrated in FIG. 2B includes the cover of a blower 205 that redirects ambient air along axis 215. In the embodiment of FIG. 2B, the ambient air is redirected by blower 205 in direction 215 towards a modular heatsink formed from two fin sets 220 and 225. In the illustrated embodiment, fin set 220 is permanently fixed to the airflow cooling element, while fin set 225 is a modular component that may be removed from the airflow cooling element and replaced with other modular components that may include an expansion card connector and may also include various configurations of fin sets. The configuration of FIG. 2B that includes a fixed fin set 220 and a modular fin set 225 may be utilized in scenarios where maximum cooling is required from the airflow cooling element.

Figure 2C:
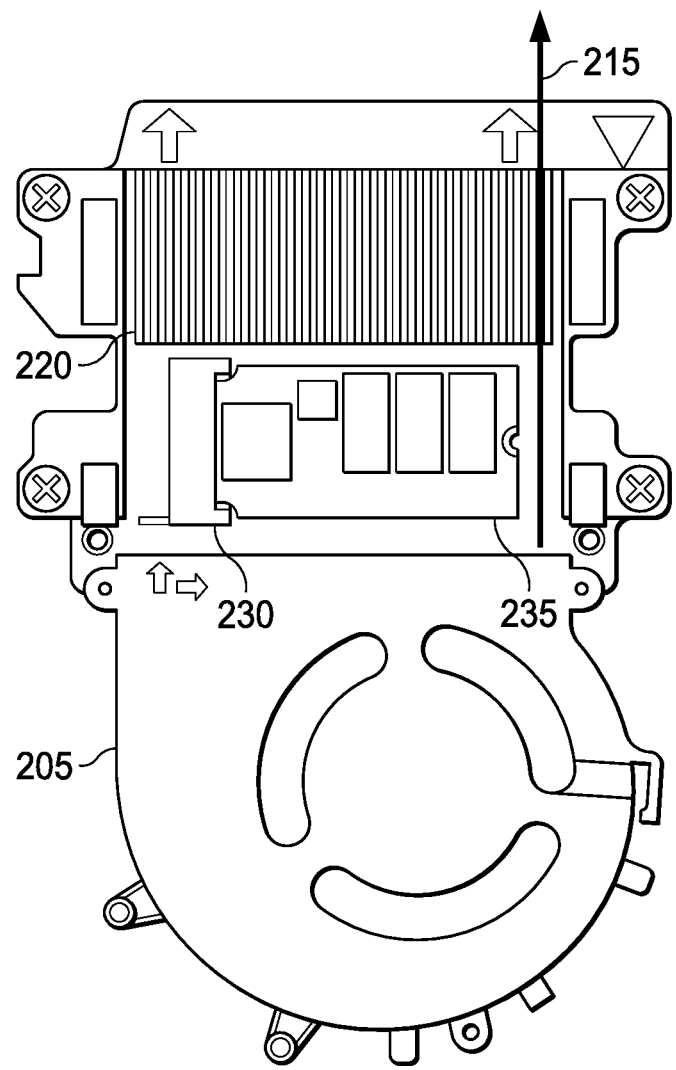
FIG. 2C is an additional illustration of an airflow cooling element consisting of a blower and a modular heatsink according to embodiments.

FIG. 2C is an illustration of an airflow cooling element consisting of a blower 205 and a modular heatsink according to embodiments. As in FIGS. 2A and 2B, the airflow cooling element illustrated in FIG. 2C includes the cover of a blower 205 that redirects ambient air along axis 215. However, in FIG. 2C, the modular fin set 225 has been replaced with a modular expansion card connector 230, to which an expansion card 235 has been coupled. In scenarios where maximum cooling is not required from the airflow cooling element, the modular fin set 225 may be removed and replaced with a modular expansion card connector 230 that supports additional performance capabilities through coupling of an expansion card 235 to the connector 230.

In some embodiments, the airflow cooling element of FIG. 2C may still include a fixed fin set 220 as well as the modular expansion card connector 230. As illustrated, the expansion card connector 230 may be located between the fixed fin set 220 and the blower 205. Configured in this manner, the expansion card 235 is cooled by ambient air redirected by the blower 205, with minimal heating of this ambient air prior to it reaching the expansion card 235. The airflow redirected by blower along direction 215 thus provides maximum available airflow cooling to expansion card 235 and also serves to ventilate heated air dissipated by fixed fin set 220. Such embodiments may be utilized in scenarios where expansion card 235 generates significant amounts of heat, such as for expansion cards that support wireless networking capabilities. Such embodiments may be particularly suited for use of expansion cards that generate significant amounts of heat and that are installed in a location within an IHS that may results in undesirable surface heat being generated by the expansion card, such as for an expansion card located under the palm rest of a notebook computer.

In the configuration illustrated in FIG. 2C, the maximum airflow cooling that may be generated by blower 205 may be directed to expansion card 235. This configuration may be used to support expansion cards 235 that generate significant amounts of heat. In other embodiments, the modular expansion card connector 230 and the fixed fin set 220 may be reversed, such that a fixed fin set is located proximally to the output of blower 205 and an expansion card is located distally from the output of blower 205, and is thus cooled by the airflow that is ventilated past the fixed fin set. Such embodiments may be utilized in scenarios where maximum available cooling is not required by expansion card 235, such as for expansion cards that include solid-state storage devices. Rather than include a fixed fin set, in some embodiments, the airflow cooling element may include two modular fin sets that may both be replaced with modular expansion card connectors. Some modular heat sink embodiments may support more than two modular components, thus supporting different combinations and ordering of fin sets and expansion card connectors. Using multiple modular fin sets also allows reconfiguration of an airflow cooling element by swapping the order of a fin set and an expansion card connector, thereby allowing a modular expansion card connector to be located closer or further from the output of blower 205 depending on the amount of heat generated by a particular expansion card. In such embodiments, one or both of the modular fin sets may be replaced with modular expansion card connectors in order to maximize performance capabilities in scenarios where the cooling provided by modular fin sets is not required.

Figure 3:
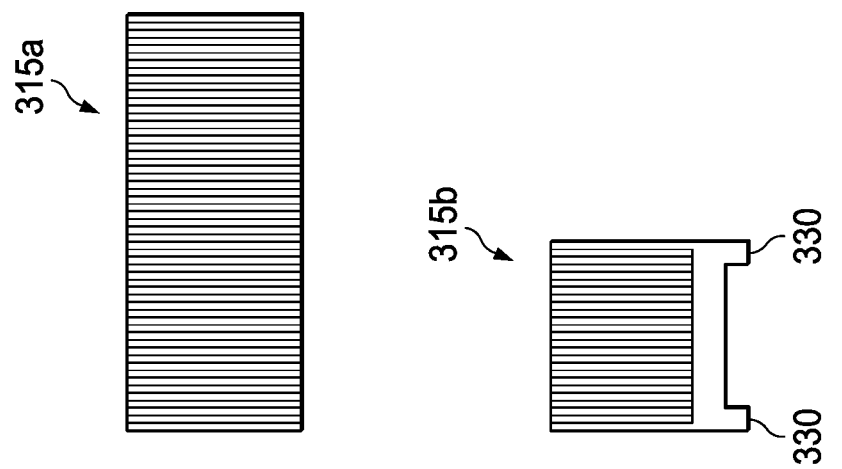
FIG. 3 is an illustration of an airflow cooling element consisting of a blower and a modular heatsink, according to embodiments, that includes a top view and a side view of a modular fin set.
Figure 3:
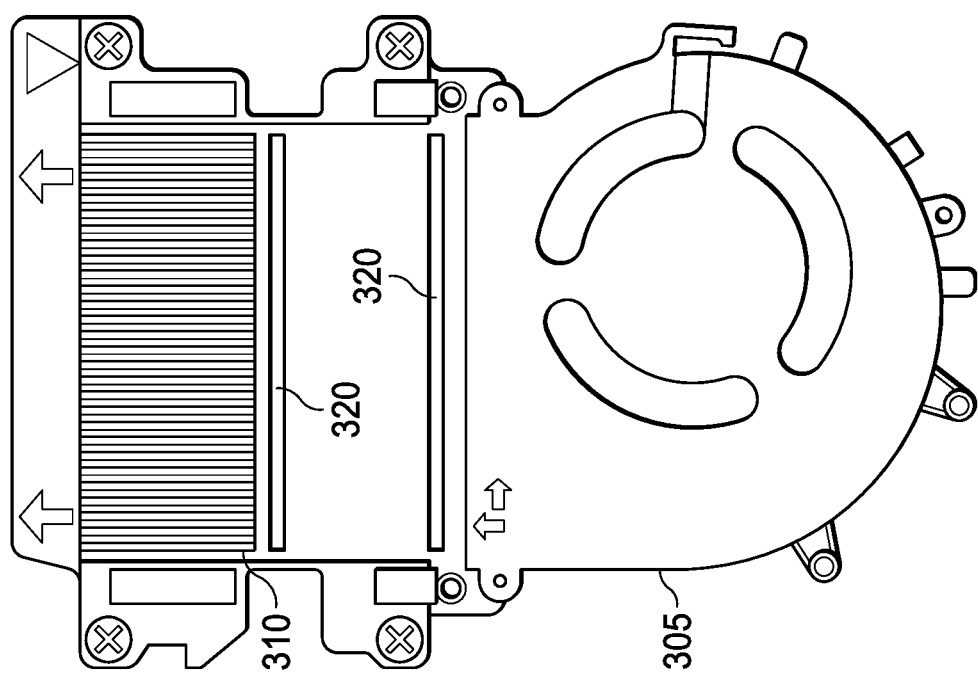

FIG. 3 is an illustration of an airflow cooling element consisting of a blower and a modular heatsink, according to embodiments. Also illustrated are a top view 315a and a side view 315b of a modular fin set that has been decoupled from the modular heat sink. As above, the airflow cooling element illustrated in FIG. 3 includes the cover of a blower 305 that redirects ambient air towards a fixed fin set 310 and the installed location of modular fin set 315a-b. In FIG. 3, the modular fin set 315a-b has been decoupled from the base of the modular heat sink by sliding it from its installed location. As illustrated, the base of the modular heat sink includes two channels 320 that run perpendicular to the direction of the airflow redirected by blower cover 305. As illustrated in the side-view 315b, the modular fin set may include rails 330 that extend along the length of the modular fin set. The modular fin set may be coupled to the airflow cooling element by sliding the rails 330 into the channels 320 in the base of the modular heat sink. The illustrated embodiment utilizes two channels 320 and two corresponding rails 330, but other embodiments may utilize different numbers and shapes of corresponding channels and rails for coupling a modular fin set to the base of a modular heat sink.

Once the rails 330 of the modular fin set 315a-b have been inserted into the corresponding channels 320, the modular fin set 315a-b may be secured to the base of a modular heatsink via screws, clips or other attachment mechanisms. In this manner, the modular fin set 315a-b may be firmly secured to the base of the airflow cooling element, thus promoting the ability for heat to be transferred from components located below the airflow cooling element to the installed modular fin set 315a-b. Rather than utilize the rails 330 and channels 320 illustrated in FIG. 3, in other embodiments, the modular fin set 315a-b may have a flat base that is secured against a flat surface of the base of the modular heat sink using screws or other attachment mechanisms.

Figure 4A:
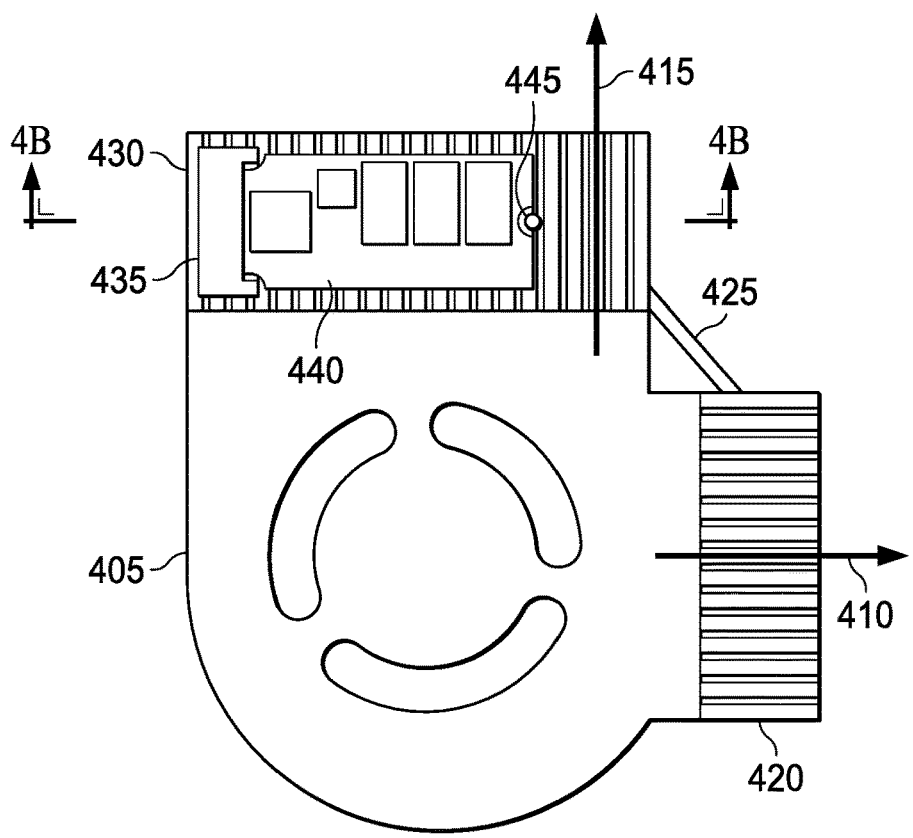
FIG. 4A is a top-view illustration of an airflow cooling element consisting of a dual-outlet blower and a modular heatsink, according to embodiments, that includes a modular fin set with an expansion card connector.

FIG. 4A is a top-view illustration of an airflow cooling element consisting of a dual-outlet blower and a modular heatsink according to embodiments that includes a modular fin set that includes both a fin set and an expansion card connector. In the prior embodiments, a single-outlet blower is utilized for cooling a modular heatsink that may include one or more modular fin sets and may also include one or more fixed fin sets. In the embodiment of FIG. 4A, a dual-outlet blower 405 is utilized that redirects ambient air both along direction 415 and direction 410. As illustrated, the ambient air redirected along direction 410 ventilates heated air dissipated by a fin set 420, which may be either a fixed fin set or may be a modular fin set according to embodiments. The ambient air redirected along direction 415 ventilates heated air dissipated by a modular fin set 430 that includes both a fin set and an expansion card connector 435 and a coupled expansion card 440. In some embodiments, fin set 420 and modular fin set 430 may be connected via a heat pipe 425 that serves to distribute heat between the two fin sets.

Figure 4B:
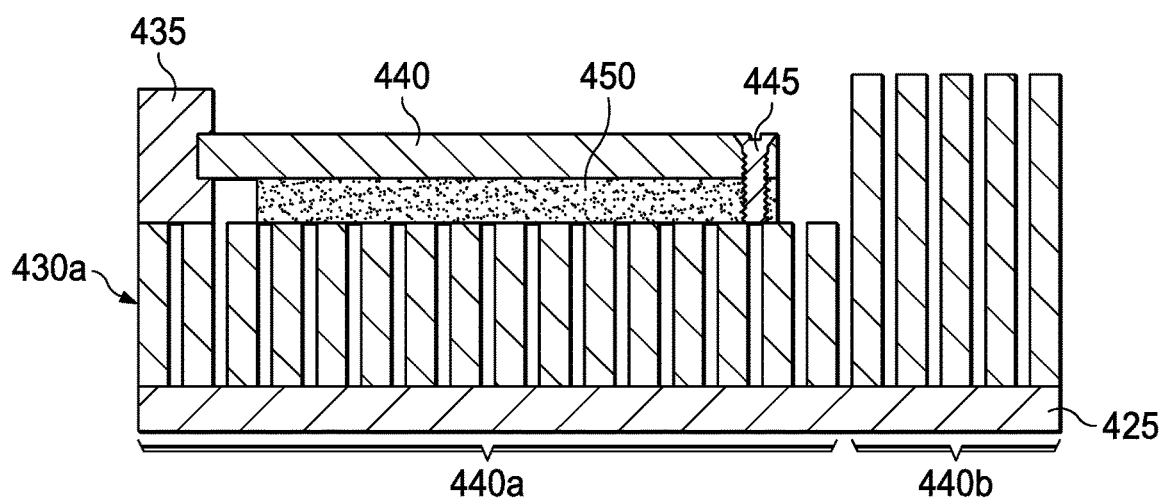
FIG. 4B is a side-view illustration of a modular fin set according to embodiments that includes an expansion card connector and two tiers of fins.
Figure 4C:
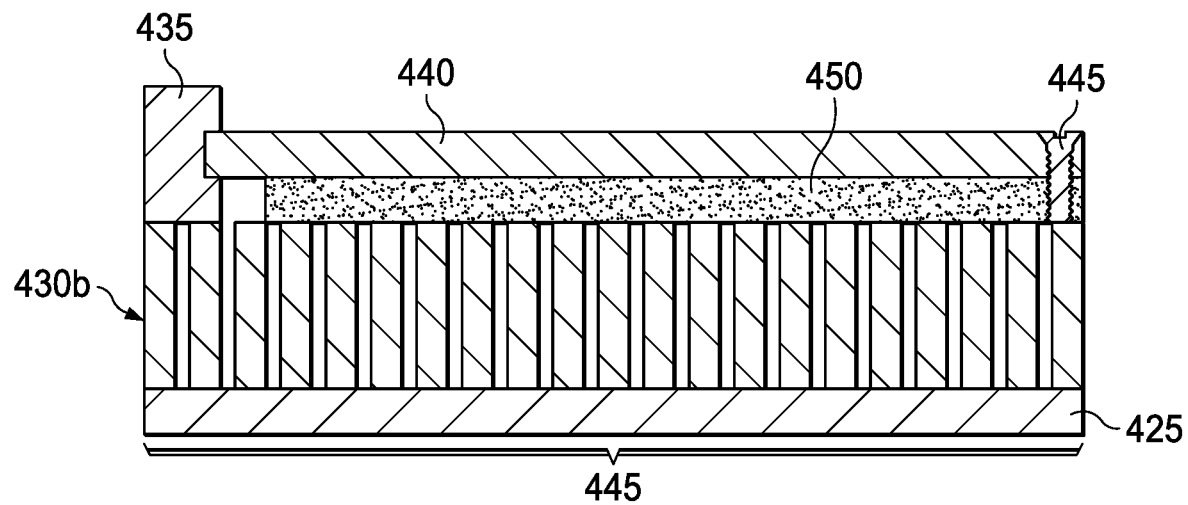
FIG. 4C is a side-view illustration of a modular fin set according to additional embodiments that includes an expansion card connector and one tier of fins.
Figure 4D:
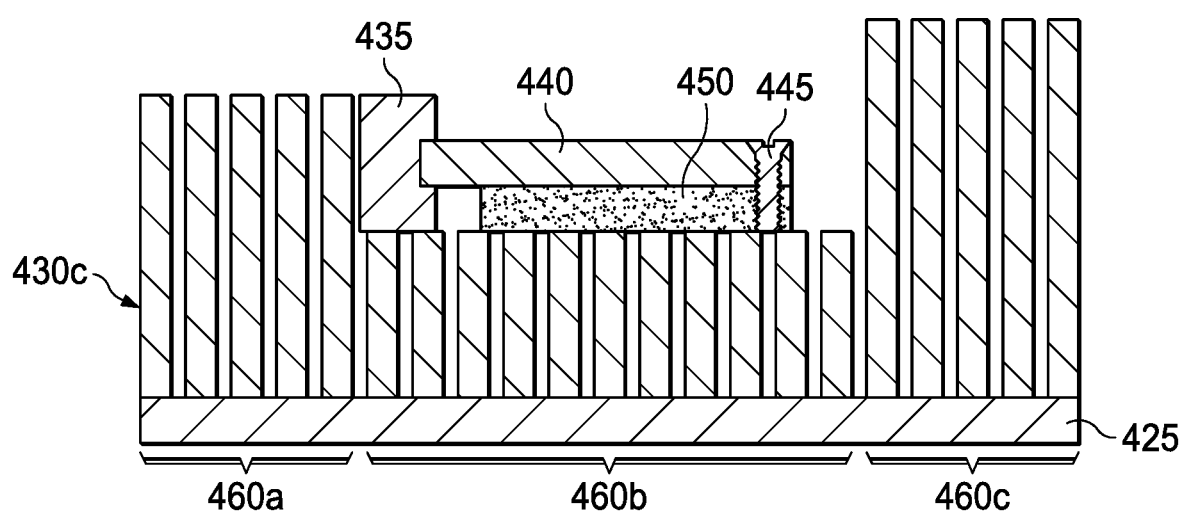
FIG. 4D is a side-view illustration of a modular fin set according to additional embodiments that includes an expansion card connector and three tiers of fins.

As a modular component of the modular heat sink, modular fin set 430 may be coupled and decoupled from the base of the heat sink. In some embodiments, modular fin set 430 may include rails, such as described with regard to FIG. 3, that are received by corresponding channels in the base of the heat sink. FIGS. 4B-D illustrates three versions of a modular fin set that may be installed to a modular heat sink in this same manner. Although not illustrated, each of the modular fin sets in FIGS. 4B-D may include rails that correspond to the channels in the base of the modular heat sink. Accordingly, the modular fin sets in FIGS. 4B-D may be interchanged as components of a modular heat sink in order to customize the performance and cooling characteristics of an IHS.

FIG. 4B is a side-view illustration of a modular fin set 430a according to embodiments that includes an expansion card connector and two tiers of fins. As illustrated in top-view FIG. 4A, an expansion card 440 that is coupled to the expansion card connector 435 of the modular fin set 430 does not always extend the full length of the modular fin set 430. As illustrated in the side-view illustration of FIG. 4B, a modular fin set 430a may include two tiers of fins that, once installed, may rest upon a heat pipe base 425 of a modular heat sink. In the embodiment of FIG. 4B, a first set of fins 440a are shorter than a second set of fins 440b. As illustrated, the expansion card connector 435 may be fastened to the top of the shorter set of fins 440a. An expansion card 440 may be coupled to the connector 435 and may be located upon a pad 445 that rests on top of the shorter set of fins 440a. In the illustrated embodiment, the expansion card 440 and/or padding 450 may be secured to the shorter set of fins 440a using a screw, bolt or other fastener 445. As illustrated, the taller set of fins 440b may rise above the expansion card 440, thus maximizing the cooling capabilities of the modular fin set 430a within the available space, while also accommodating the placement of the expansion card 440 on top of the shorter set of vents 440a. Using the two-tier configuration of fins in FIG. 4A, embodiments may accommodate an expansion card 440 while also utilizing the available space to maximize the surface area of the fins 440a-b of the modular fin set 430a.

FIG. 4C is a side-view illustration of an additional modular fin set 430b according to embodiments that includes an expansion card connector 435 and one tier of fins 445. In the modular fin set 430b of FIG. 4C, the expansion card 440 extends the length of the modular fin set 430b and rests on a single tier of fins 445. As before, the expansion card 440 is coupled to an expansion card connector 435 and rests on a pad 450, where the expansion card 440 and/or pad 450 are secured to the fins using fastener 445. Using the embodiment of FIG. 4C, longer expansion cards 440 may be accommodated, while still utilizing the available space to maximize the surface area of the fins 445 of the modular fin set 430b. In some embodiments, the single tier of fins 445 may be made as tall as possible while maintaining the connector 435 and expansion card 440 within the available space.

FIG. 4D is a side-view illustration of an additional modular fin set 430c according to embodiments that includes an expansion card connector 435 and three tiers of fins 460a-c. As before, the expansion card 440 is coupled to an expansion card connector 435 and rests on a pad 450, where the expansion card 440 and/or pad 450 are fastened to the middle tier of fins 460b using a fastener 445. In the embodiment of FIG. 4D, a first tier of fins 460a rises to a first height that extends above the expansion card 440. As illustrated, the expansion card 440 rests on a shorter, second tier of fins 460b. A third tier of fins 460c may rise to a second height that is greater than the height of the first tier of fins 460a. Embodiments may utilize various combination of heights and numbers of tiers of a modular fin set that include an expansion card connector. Utilizing multiple tiers of fins 460a-c, modular fin set embodiments may support an expansion card while maximizing the height of the fins within the various geometries of the spaces in which a modular heat sink may be installed.

It should be understood that various operations described herein may be implemented in software executed by processing circuitry, hardware, or a combination thereof. The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

The terms "tangible" and "non-transitory," as used herein, are intended to describe a computer-readable storage medium (or "memory") excluding propagating electromagnetic signals; but are not intended to otherwise limit the type of physical computer-readable storage device that is encompassed by the phrase computer-readable medium or memory. For instance, the terms "non-transitory computer readable medium" or "tangible memory" are intended to encompass types of storage devices that do not necessarily store information permanently, including, for example, RAM. Program instructions and data stored on a tangible computer-accessible storage medium in non-transitory form may afterwards be transmitted by transmission media or signals such as electrical, electromagnetic, or digital signals, which may be conveyed via a communication medium such as a network and/or a wireless link.

Also for purposes of this disclosure, computer-readable media may include any instrumentality or aggregation of instrumentalities that may retain data and/or instructions for a period of time. Computer-readable media may include, without limitation, storage media, e.g., a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory. Computer-readable media may also include optically readable barcodes (one or two-dimensional), plastic cards with embedded magnetic stripes, mechanically or optically read punched cards, or radio frequency identification tags.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. A heat sink for dissipating heat within an IHS (Information Handling System), the heat sink comprising:
   a first fin set that is permanently fixed to the heat sink;
   a second fin set that is removably coupled to a first location on a base of the heat sink; and
   an expansion card connector that is removably coupled to the first location on the base of the heat sink.

2. The heat sink of claim 1, wherein the expansion card connector comprises a third fin set, and wherein the expansion card connector is fastened on top of the third fin set.

3. The heat sink of claim 2, wherein the third fin set of the expansion card connector comprises of a plurality of tiers of fins.

4. The heat sink of claim 3, wherein the expansion card connector is fastened on top of a lowest tier of the third fin set.

5. The heat sink of claim 1, wherein the base of the heat sink comprises a plurality of channels that receive a corresponding plurality of rails of the second fin set.

6. The heat sink of claim 5, wherein the plurality of channels of the heat sink base further receive a corresponding plurality of rails of the expansion card connector.

7. The heat sink of claim 5, wherein the second fin set is coupled to the base of the heat sink by sliding the plurality of rails of the second fin set into the corresponding channels of the base.

8. The heat sink of claim 1, wherein the expansion card connector comprises an M.2 connector.

9. The heat sink of claim 1, wherein the expansion card connector comprises a USB-C connector.

10. A heat sink for dissipating heat within an IHS (Information Handling System), the heat sink comprising:
    a first fin set that is removably coupled to a first location on a base of the heat sink;
    a second fin set that is removably coupled to a second location on the base of the heat sink; and
    an expansion card connector that is removably coupled to the first location or to the second location on the base of the heat sink.

11. The heat sink of claim 10, wherein the expansion card connector comprises a third fin set, and wherein the expansion card connector is fastened on top of the third fin set.

12. The heat sink of claim 11, wherein the third fin set of the expansion card connector comprises of a plurality of tiers of fins, and wherein the expansion card connector is fastened on top of a lowest tier of the third fin set.

13. The heat sink of claim 10, wherein the base of the heat sink comprises a plurality of channels that receive a corresponding plurality of rails of the first fin set and a corresponding plurality of rails of the second fin set.

14. The heat sink of claim 10, wherein the expansion card connector comprises an M.2 connector or a USB-C connector.

15. An IHS (Information Handling System) comprising:
    a processor;
    a plurality of cooling fans directing airflow towards a heat sink; and
    the heat sink comprising:
      a first fin set that is permanently fixed to the heat sink;
      a second fin set that is removably coupled to a first location on a base of the heat sink; and
      an expansion card connector that is removably coupled to the first location on the base of the heat sink.

16. The IHS of claim 15, wherein the expansion card connector comprises a third fin set, and wherein the expansion card connector is fastened on top of the third fin set.

17. The IHS of claim 16, wherein the third fin set of the expansion card connector comprises of a plurality of tiers of fins, and wherein the expansion card connector is fastened on top of a lowest tier of the third fin set.

18. The IHS of claim 15, wherein the base of the heat sink comprises a plurality of channels that receive a corresponding plurality of rails of the second fin set.

19. The IHS of claim 15, wherein the expansion card connector comprises an M.2 connector or a USB-C connector.

20. The IHS of claim 15, wherein an expansion card is coupled to the IHS by coupling the expansion card to the expansion card connector.

* * * * *